United States Patent [19]

Fleming-Dahl

[11] Patent Number: 5,218,326
[45] Date of Patent: Jun. 8, 1993

[54] DISTRIBUTED REFLECTION SCRAMBLING TECHNIQUE

[75] Inventor: Arthur Fleming-Dahl, Miller Place, N.Y.

[73] Assignee: Grumman Aerospace Corporation, Bethpage, N.Y.

[21] Appl. No.: 858,427

[22] Filed: Mar. 24, 1992

Related U.S. Application Data

[63] Continuation of Ser. No. 612,441, Nov. 14, 1990, abandoned.

[51] Int. Cl.$^5$ ............................................. H03H 7/38
[52] U.S. Cl. ...................................... 333/33; 333/245
[58] Field of Search ............... 333/245, 236, 239, 242, 333/32, 33

[56] References Cited

U.S. PATENT DOCUMENTS 2,041,378  5/1936  Smith ..................................... 333/33

Primary Examiner—Robert J. Pascal
Assistant Examiner—Seung Ham
Attorney, Agent, or Firm—Bacon & Thomas

[57] ABSTRACT

A method of defining component lengths, especially cable lengths, in a radio frequency or microwave system so as to minimize in-phase coupling of voltage reflections in the system involves the use of prime roots of prime numbers as scaling factors which are multiplied with a minimum component length to obtain a list of potential component lengths. The scaled potential component lengths are then screened for accidental relationships with component lengths obtained using lower order roots in order to prevent accidental harmonic relationships from arising in the system, and the resulting screened list is evaluated to ensure that the remaining potential component lengths meet such system requirements as available spans, minimum and maximum component lengths, number of lengths required, and matched Insertion Loss requirements. In order to screen the scaled potential component lengths, windows are constructed around the potential lengths based on component manufacturing tolerances, and subsequently adjusted as necessary.

16 Claims, 18 Drawing Sheets

| Cable Dash No. | 5/dash √ no. Factor | Smallest Length 5.500" Cable Length | Cable Span | Manufacturing Tolerances + | Manufacturing Tolerances − | |
|---|---|---|---|---|---|---|
| −3   | 1.2457 | 6.8514  | 2.6014  | 0.000 | 0.200 | |
| −7   | 1.4758 | 8.1169  | 3.8669  | 0.000 | 0.200 | |
| −17  | 1.7623 | 9.6927  | 5.4427  | 0.150 | 0.050 | |
| −23  | 1.8722 | 10.2971 | 6.0471  | 0.050 | 0.150 | |
| −29  | 1.9610 | 10.7855 | 6.5355  | 0.100 | 0.100 | Matched #1 |
| −37  | 2.0589 | 11.3240 | 7.0740  | 0.100 | 0.100 | |
| −61  | 2.2754 | 12.5147 | 8.2647  | 0.100 | 0.100 | |
| −83  | 2.4200 | 13.3100 | 9.0600  | 0.100 | 0.100 | |
| −223 | 2.9489 | 16.2190 | 11.9690 | 0.125 | 0.075 | |
| −293 | 3.1144 | 17.1292 | 12.8792 | 0.100 | 0.100 | |
| −383 | 3.2858 | 18.0719 | 13.8219 | 0.100 | 0.100 | Matched #2 |
| −503 | 3.4699 | 19.0845 | 14.8345 | 0.100 | 0.100 | |

| Cable Dash No. | $\sqrt{5/\text{dash no.}}$ Factor | Smallest Length 5.500" Cable Length | Cable Span | Manufacturing Tolerances + | − | |
|---|---|---|---|---|---|---|
| −3 | 1.2457 | 6.8514 | 2.6014 | 0.000 | 0.200 | |
| −7 | 1.4758 | 8.1169 | 3.8669 | 0.000 | 0.200 | |
| −17 | 1.7623 | 9.6927 | 5.4427 | 0.150 | 0.050 | |
| −23 | 1.8722 | 10.2971 | 6.0471 | 0.050 | 0.150 | |
| −29 | 1.9610 | 10.7855 | 6.5355 | 0.100 | 0.100 | Matched #1 |
| −37 | 2.0589 | 11.3240 | 7.0740 | 0.100 | 0.100 | |
| −61 | 2.2754 | 12.5147 | 8.2647 | 0.100 | 0.100 | |
| −83 | 2.4200 | 13.3100 | 9.0600 | 0.100 | 0.100 | |
| −223 | 2.9489 | 16.2190 | 11.9690 | 0.125 | 0.075 | |
| −293 | 3.1144 | 17.1292 | 12.8792 | 0.100 | 0.100 | |
| −383 | 3.2858 | 18.0719 | 13.8219 | 0.100 | 0.100 | Matched #2 |
| −503 | 3.4699 | 19.0845 | 14.8345 | 0.100 | 0.100 | |

FIG. 1

| Cable Dash No. | $\sqrt{2/\text{dash no.}}$ Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -1 | 1.0000 | 5.0000 | 6.0000 | 7.0000 | 8.0000 | 5.5000 |
| -2 | 1.4142 | | | 9.8994 | | 7.7781 |
| -3 | 1.7321 | | | 12.1247 | | 9.5266 |
| -5 | 2.2361 | | | 15.6527 | | 12.2986 |
| -7 | 2.6458 | | | 18.5206 | | 14.5519 |
| -11 | 3.3166 | | | 23.2162 | | 18.2413 |
| -13 | 3.6056 | | | 25.2392 | | 19.8308 |
| -17 | 4.1231 | | | 28.8617 | | 22.6771 |
| -19 | 4.3589 | | | 30.5123 | | 23.9740 |
| -23 | 4.7958 | | | 33.5706 | | 26.3769 |
| -29 | 5.3852 | | | 37.6964 | | 29.6186 |

FIG. 2

| Cable Dash No. | 3/dash √ no. Factor | Cable Length (inches) | | | | | |
|---|---|---|---|---|---|---|---|
| | | Smallest Length 5" | Smallest Length 6" | Smallest Length 7" | Smallest Length 8" | Smallest Length 5.500" | |
| -1 | 1.0000 | 5.0000 | 6.0000 | 7.0000 | 8.0000 | 5.5000 | |
| -2 | 1.2599 | 6.2996 | 7.5595 | 8.8193 | 10.0794 | 6.9295 | ←avoid |
| -3 | 1.4422 | 7.2110 | 8.6532 | 10.0954 | 11.5376 | 7.9321 | |
| -5 | 1.7100 | 8.5500 | 10.2600 | 11.9700 | 13.6800 | 9.4050 | |
| -7 | 1.9129 | 9.5645 | 11.4774 | 13.3903 | 15.3032 | 10.5210 | |
| -11 | 2.2240 | 11.1200 | 13.3440 | 15.5680 | 17.7920 | 12.2320 | |
| -13 | 2.3513 | 11.7565 | 14.1078 | 16.4591 | 18.8104 | 12.9322 | |
| -17 | 2.5713 | 12.8565 | 15.4278 | 17.9991 | 20.5704 | 14.1422 | |
| -19 | 2.6684 | 13.3420 | 16.0104 | 18.6788 | 21.3472 | 14.6762 | |
| -23 | 2.8439 | 14.2159 | 17.0634 | 19.9073 | 22.7512 | 15.6415 | |
| -29 | 3.0723 | 15.3615 | 18.4338 | 21.5061 | 24.5784 | 16.8977 | |
| -31 | 3.1414 | 15.7070 | 18.8484 | 21.9898 | 25.1312 | 17.2777 | |
| -37 | 3.3322 | 16.6610 | 19.9932 | 23.3254 | 26.6576 | 18.3271 | |
| -41 | 3.4482 | 17.2410 | 20.6892 | 24.1374 | 27.5856 | 18.9651 | |
| -43 | 3.5034 | 17.5170 | 21.0204 | 24.5238 | 28.0272 | 19.2687 | |
| -47 | 3.6088 | 18.0440 | 21.6528 | 25.2616 | 28.8704 | 19.8484 | |
| -53 | 3.7563 | | | 26.2941 | | 20.6597 | |
| -59 | 3.8930 | | | 27.2510 | | 21.4115 | |
| -61 | 3.9365 | | | 27.5555 | | 21.6508 | |
| -67 | 4.0615 | | | 28.4305 | | 22.3383 | |

FIG. 3A

| Cable Dash No. | $\sqrt[3]{\text{dash no.}}$ Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -71  | 4.1408 | | | 28.9856 | | 22.7744 |
| -73  | 4.1793 | | | 29.2551 | | 22.9862 |
| -79  | 4.2908 | | | 30.0356 | | 23.5994 |
| -83  | 4.3621 | | | 30.5347 | | 23.9916 |
| -89  | 4.4647 | | | 31.2529 | | 24.5559 |
| -97  | 4.5947 | | | 32.1629 | | 25.2709 |
| -101 | 4.6570 | | | 32.5990 | | 25.6135 |
| -103 | 4.6875 | | | 32.8125 | | 25.7813 |
| -107 | 4.7475 | | | 33.2325 | | 26.1113 |
| -109 | 4.7769 | | | 33.4383 | | 26.2730 |
| -113 | 4.8346 | | | 33.8422 | | 26.5903 |
| -127 | 5.0265 | | | 35.1855 | | 27.6458 |

FIG. 3B

| Cable Dash No. | 4/√dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -1 | 1.0000 | 5.0000 | 6.0000 | 7.0000 | 8.0000 | 5.5000 |
| -2 | 1.1892 | | | 8.3244 | | 6.5406 ←-avoid |
| -3 | 1.3161 | | | 9.2127 | | 7.2386 |
| -5 | 1.4953 | | | 10.4671 | | 8.2242 |
| -7 | 1.6266 | | | 11.3862 | | 8.9463 |
| -11 | 1.8212 | | | 12.7484 | | 10.0166 |
| -13 | 1.8988 | | | 13.2916 | | 10.4434 |
| -17 | 2.0305 | | | 14.2135 | | 11.1678 |
| -19 | 2.0878 | | | 14.6146 | | 11.4829 |
| -23 | 2.1899 | | | 15.3293 | | 12.0445 |
| -29 | 2.3206 | | | 16.2442 | | 12.7633 |
| -31 | 2.3596 | | | 16.5172 | | 12.9778 |
| -37 | 2.4663 | | | 17.2641 | | 13.5647 |
| -41 | 2.5304 | | | 17.7128 | | 13.9172 |
| -43 | 2.5607 | | | 17.9249 | | 14.0839 |
| -47 | 2.6183 | | | 18.3281 | | 14.4007 |
| -53 | 2.6982 | | | 18.8874 | | 14.8401 |
| -59 | 2.7715 | | | 19.4005 | | 15.2433 |
| -61 | 2.7947 | | | 19.5629 | | 15.3709 |
| -67 | 2.8610 | | | 20.0270 | | 15.7355 |

FIG. 4A

| Cable Dash No. | 4/√ dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -71 | 2.9028 | | | 20.3196 | | 15.9654 |
| -73 | 2.9230 | | | 20.4610 | | 16.0765 |
| -79 | 2.9813 | | | 20.8691 | | 16.3972 |
| -83 | 3.0183 | | | 21.1281 | | 16.6007 |
| -89 | 3.0715 | | | 21.5005 | | 16.8933 |
| -97 | 3.1383 | | | 21.9681 | | 17.2607 |
| -101 | 3.1702 | | | 22.1914 | | 17.4361 |
| -103 | 3.1857 | | | 22.2999 | | 17.5214 |
| -107 | 3.2162 | | | 22.5134 | | 17.6891 |
| -109 | 3.2311 | | | 22.6177 | | 17.7711 |
| -113 | 3.2604 | | | 22.8228 | | 17.9322 |
| -127 | 3.3570 | | | 23.4990 | | 18.4635 |
| -131 | 3.3831 | | | 23.6817 | | 18.6071 |
| -137 | 3.4212 | | | 23.9484 | | 18.8166 |
| -139 | 3.4336 | | | 24.0352 | | 18.8848 |
| -149 | 3.4938 | | | 24.4566 | | 19.2159 |
| -151 | 3.5055 | | | 24.5385 | | 19.2803 |
| -157 | 3.5398 | | | 24.7786 | | 19.4689 |
| -163 | 3.5731 | | | 25.0117 | | 19.6521 |
| -167 | 3.5948 | | | 25.1636 | | 19.7714 |

FIG. 4B

| Cable Dash No. | 4/dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -173 | 3.6267 | | | 25.3869 | | 19.9469 |
| -179 | 3.6577 | | | 25.6039 | | 20.1174 |
| -181 | 3.6679 | | | 25.6753 | | 20.1735 |
| -191 | 3.7176 | | | 26.0232 | | 20.4468 |
| -193 | 3.7273 | | | 26.0911 | | 20.5002 |
| -197 | 3.7464 | | | 26.2248 | | 20.6052 |
| -199 | 3.7559 | | | 26.2913 | | 20.6575 |
| -211 | 3.8113 | | | 26.6791 | | 20.9622 |
| -223 | 3.8643 | | | 27.0501 | | 21.2537 |
| -227 | 3.8816 | | | 27.1712 | | 21.3488 |
| -229 | 3.8901 | | | 27.2307 | | 21.3956 |
| -233 | 3.9070 | | | 27.3490 | | 21.4885 |
| -239 | 3.9319 | | | 27.5233 | | 21.6255 |
| -241 | 3.9401 | | | 27.5807 | | 21.6706 |
| -251 | 3.9803 | | | 27.8621 | | 21.8917 |
| -257 | 4.0039 | | | 28.0273 | | 22.0215 |
| -263 | 4.0271 | | | 28.1897 | | 22.1491 |
| -269 | 4.0498 | | | 28.3486 | | 22.2739 |
| -271 | 4.0573 | | | 28.4011 | | 22.3152 |
| -277 | 4.0796 | | | 28.5572 | | 22.4378 |

FIG. 4C

| Cable Dash No. | 4/dash √/ no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -281 | 4.0943 | | | 28.6601 | | 22.5187 |
| -283 | 4.1015 | | | 28.7105 | | 22.5583 |
| -293 | 4.1373 | | | 28.9611 | | 22.7552 |
| -307 | 4.1859 | | | 29.3013 | | 23.0225 |
| -311 | 4.1994 | | | 29.3958 | | 23.0967 |
| -313 | 4.2062 | | | 29.4434 | | 23.1341 |
| -317 | 4.2195 | | | 29.5365 | | 23.2073 |
| -331 | 4.2654 | | | 29.8578 | | 23.4579 |
| -337 | 4.2846 | | | 29.9922 | | 23.5653 |
| -347 | 4.3160 | | | 30.2120 | | 23.7380 |
| -349 | 4.3222 | | | 30.2554 | | 23.7721 |
| -353 | 4.3345 | | | 30.3415 | | 23.8398 |
| -359 | 4.3528 | | | 30.4696 | | 23.9404 |
| -367 | 4.3769 | | | 30.6383 | | 24.0730 |
| -373 | 4.3947 | | | 30.7629 | | 24.1709 |
| -379 | 4.4122 | | | 30.8854 | | 24.2671 |
| -383 | 4.4238 | | | 30.9666 | | 24.3309 |
| -389 | 4.4411 | | | 31.0877 | | 24.4261 |
| -397 | 4.4637 | | | 31.2459 | | 24.5504 |
| -401 | 4.4749 | | | 31.3243 | | 24.6120 |

FIG. 4D

| Cable Dash No. | 4/dash √/ no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -409 | 4.4971 | | | 31.4797 | | 24.7341 |
| -419 | 4.5243 | | | 31.6701 | | 24.8837 |
| -421 | 4.5297 | | | 31.7079 | | 24.9134 |
| -431 | 4.5564 | | | 31.8948 | | 25.0602 |
| -433 | 4.5617 | | | 31.9319 | | 25.0894 |
| -439 | 4.5774 | | | 32.0418 | | 25.1757 |
| -443 | 4.5878 | | | 32.1146 | | 25.2329 |
| -449 | 4.6032 | | | 32.2224 | | 25.3176 |
| -457 | 4.6236 | | | 32.3652 | | 25.4298 |
| -461 | 4.6337 | | | 32.4359 | | 25.4854 |
| -463 | 4.6387 | | | 32.4709 | | 25.5129 |
| -467 | 4.6487 | | | 32.5409 | | 25.5679 |
| -479 | 4.6783 | | | 32.7481 | | 25.7307 |
| -487 | 4.6977 | | | 32.8839 | | 25.8374 |
| -491 | 4.7073 | | | 32.9511 | | 25.8902 |
| -499 | 4.7263 | | | 33.0841 | | 25.9947 |
| -503 | 4.7358 | | | 33.1506 | | 26.0469 |
| -509 | 4.7496 | | | 33.2486 | | 26.1239 |
| -521 | 4.7776 | | | 33.4432 | | 26.2768 |
| -523 | 4.7822 | | | 33.4754 | | 26.3021 |

FIG. 4E

| Cable Dash No. | √5/dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -1 | 1.0000 | 5.0000 | 6.0000 | 7.0000 | 8.0000 | 5.5000 |
| -2 | 1.1487 | | | 8.0409 | | 6.3179 ←-avoid |
| -3 | 1.2457 | | | 8.7199 | | 6.8514 |
| -5 | 1.3797 | | | 9.6579 | | 7.5884 |
| -7 | 1.4758 | | | 10.3306 | | 8.1169 |
| -11 | 1.6154 | | | 11.3078 | | 8.8847 |
| -13 | 1.6703 | | | 11.6921 | | 9.1867 |
| -17 | 1.7623 | | | 12.3361 | | 9.6927 |
| -19 | 1.8020 | | | 12.6140 | | 9.9110 |
| -23 | 1.8722 | | | 13.1054 | | 10.2971 |
| -29 | 1.9610 | | | 13.7270 | | 10.7855 |
| -31 | 1.9873 | | | 13.9111 | | 10.9302 |
| -37 | 2.0589 | | | 14.4123 | | 11.3240 |
| -41 | 2.1016 | | | 14.7112 | | 11.5588 |
| -43 | 2.1217 | | | 14.8519 | | 11.6694 |
| -47 | 2.1598 | | | 15.1186 | | 11.8789 |
| -53 | 2.2124 | | | 15.4868 | | 12.1682 |
| -59 | 2.2603 | | | 15.8221 | | 12.4317 |
| -61 | 2.2754 | | | 15.9278 | | 12.5147 |
| -67 | 2.3185 | | | 16.2295 | | 12.7518 |

FIG. 5A

| Cable Dash No. | $\delta/\text{dash no.}$ Factor | Cable Length (inches) | | | | |
|---|---|---|---|---|---|---|
| | | Smallest Length 5° | Smallest Length 6° | Smallest Length 7° | Smallest Length 8° | Smallest Length 5.500° |
| -71  | 2.3456 | | | 16.4192 | | 12.9008 |
| -73  | 2.3587 | | | 16.5109 | | 12.9729 |
| -79  | 2.3962 | | | 16.7734 | | 13.1791 |
| -83  | 2.4200 | | | 16.9400 | | 13.3100 |
| -89  | 2.4540 | | | 17.1780 | | 13.4970 |
| -97  | 2.4966 | | | 17.4762 | | 13.7313 |
| -101 | 2.5169 | | | 17.6183 | | 13.8430 |
| -103 | 2.5268 | | | 17.6876 | | 13.8974 |
| -107 | 2.5461 | | | 17.8227 | | 14.0036 |
| -109 | 2.5556 | | | 17.8892 | | 14.0558 |
| -113 | 2.5740 | | | 18.0180 | | 14.1570 |
| -127 | 2.6349 | | | 18.4443 | | 14.4920 |
| -131 | 2.6513 | | | 18.5591 | | 14.5822 |
| -137 | 2.6751 | | | 18.7257 | | 14.7131 |
| -139 | 2.6829 | | | 18.7803 | | 14.7560 |
| -149 | 2.7204 | | | 19.0428 | | 14.9622 |
| -151 | 2.7277 | | | 19.0939 | | 15.0024 |
| -157 | 2.7490 | | | 19.2430 | | 15.1195 |
| -163 | 2.7697 | | | 19.3879 | | 15.2334 |
| -167 | 2.7832 | | | 19.4824 | | 15.3076 |

FIG. 5B

| Cable Dash No. | 5/dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -173 | 2.8029 | | | 19.6203 | | 15.4160 |
| -179 | 2.8221 | | | 19.7547 | | 15.5216 |
| -181 | 2.8284 | | | 19.7988 | | 15.5562 |
| -191 | 2.8590 | | | 20.0130 | | 15.7245 |
| -193 | 2.8649 | | | 20.0543 | | 15.7570 |
| -197 | 2.8767 | | | 20.1369 | | 15.8219 |
| -199 | 2.8825 | | | 20.1775 | | 15.8538 |
| -211 | 2.9165 | | | 20.4155 | | 16.0408 |
| -223 | 2.9489 | | | 20.6423 | | 16.2190 |
| -227 | 2.9594 | | | 20.7158 | | 16.2767 |
| -229 | 2.9646 | | | 20.7522 | | 16.3053 |
| -233 | 2.9749 | | | 20.8243 | | 16.3620 |
| -239 | 2.9901 | | | 20.9307 | | 16.4456 |
| -241 | 2.9950 | | | 20.9650 | | 16.4725 |
| -251 | 3.0195 | | | 21.1365 | | 16.6073 |
| -257 | 3.0338 | | | 21.2366 | | 16.6859 |
| -263 | 3.0478 | | | 21.3346 | | 16.7629 |
| -269 | 3.0616 | | | 21.4312 | | 16.8388 |
| -271 | 3.0662 | | | 21.4634 | | 16.8641 |
| -277 | 3.0796 | | | 21.5572 | | 16.9378 |

FIG. 5C

| Cable Dash No. | S/dash no. Factor | Cable Length (inches) | | | | |
|---|---|---|---|---|---|---|
| | | Smallest Length 5" | Smallest Length 6" | Smallest Length 7" | Smallest Length 8" | Smallest Length 5.500" |
| -281 | 3.0885 | | | 21.6195 | | 16.9666 |
| -283 | 3.0928 | | | 21.6496 | | 17.0104 |
| -293 | 3.1144 | | | 21.8008 | | 17.1292 |
| -307 | 3.1436 | | | 22.0052 | | 17.2898 |
| -311 | 3.1518 | | | 22.0626 | | 17.3349 |
| -313 | 3.1558 | | | 22.0906 | | 17.3569 |
| -317 | 3.1638 | | | 22.1466 | | 17.4009 |
| -331 | 3.1913 | | | 22.3391 | | 17.5522 |
| -337 | 3.2028 | | | 22.4196 | | 17.6154 |
| -347 | 3.2216 | | | 22.5512 | | 17.7188 |
| -349 | 3.2253 | | | 22.5771 | | 17.7392 |
| -353 | 3.2326 | | | 22.6282 | | 17.7793 |
| -359 | 3.2435 | | | 22.7045 | | 17.8393 |
| -367 | 3.2579 | | | 22.8053 | | 17.9185 |
| -373 | 3.2684 | | | 22.8788 | | 17.9762 |
| -379 | 3.2789 | | | 22.9523 | | 18.0340 |
| -383 | 3.2858 | | | 23.0006 | | 18.0719 |
| -389 | 3.2960 | | | 23.0720 | | 18.1280 |
| -397 | 3.3095 | | | 23.1665 | | 18.2023 |
| -401 | 3.3161 | | | 23.2127 | | 18.2386 |

FIG. 5D

| Cable Dash No. | 5/dash no. Factor | Cable Length (inches) | | | | |
|---|---|---|---|---|---|---|
| | | Smallest Length 5" | Smallest Length 6" | Smallest Length 7" | Smallest Length 8" | Smallest Length 8.500" |
| -409 | 3.3292 | | | 23.3044 | | 18.3106 |
| -419 | 3.3454 | | | 23.4178 | | 18.3997 |
| -421 | 3.3485 | | | 23.4395 | | 18.4168 |
| -431 | 3.3643 | | | 23.5501 | | 18.5037 |
| -433 | 3.3674 | | | 23.5718 | | 18.5207 |
| -439 | 3.3767 | | | 23.6369 | | 18.5719 |
| -443 | 3.3828 | | | 23.6796 | | 18.6054 |
| -449 | 3.3919 | | | 23.7433 | | 18.6555 |
| -457 | 3.4040 | | | 23.8280 | | 18.7220 |
| -461 | 3.4099 | | | 23.8693 | | 18.7545 |
| -463 | 3.4128 | | | 23.8896 | | 18.7704 |
| -467 | 3.4187 | | | 23.9309 | | 18.8029 |
| -479 | 3.4361 | | | 24.0527 | | 18.8986 |
| -487 | 3.4475 | | | 24.1325 | | 18.9613 |
| -491 | 3.4532 | | | 24.1724 | | 18.9926 |
| -499 | 3.4643 | | | 24.2501 | | 19.0537 |
| -503 | 3.4699 | | | 24.2893 | | 19.0845 |
| -509 | 3.4781 | | | 24.3467 | | 19.1296 |
| -521 | 3.4944 | | | 24.4608 | | 19.2192 |
| -523 | 3.4970 | | | 24.4790 | | 19.2335 |

FIG. 5E

| Cable Dash No. | $\sqrt{5/\text{dash no.}}$ Factor | Smallest Length 7" Cable Length | Cable Span |
|---|---|---|---|
| -1 | 1.0000 | 7.0000 | 2.7500 |
| -3 | 1.2457 | 8.7199 | 4.4699 |
| -5 | 1.3797 | 9.6579 | 5.4079 |
| -7 | 1.4758 | 10.3306 | 6.0806 |
| -13 | 1.6703 | 11.6921 | 7.4421 |
| -17 | 1.7623 | 12.3361 | 8.0861 |
| -19 | 1.8020 | 12.6140 | 8.3640 |
| -23 | 1.8722 | 13.1054 | 8.8554 |
| -29 | 1.9610 | 13.7270 | 9.4770 |
| -31 | 1.9873 | 13.9111 | 9.6611 |
| -37 | 2.0589 | 14.4123 | 10.1623 |
| -43 | 2.1217 | 14.8519 | 10.6019 |
| -47 | 2.1598 | 15.1186 | 10.8686 |
| -59 | 2.2603 | 15.8221 | 11.5721 |

FIG. 6A

| Cable Dash No. | 5/dash no. Factor | Smallest Length 7" Cable Length | Cable Span |
|---|---|---|---|
| -61 | 2.2754 | 15.9278 | 11.6778 |
| -79 | 2.3962 | 16.7734 | 12.5234 |
| -83 | 2.4200 | 16.9400 | 12.6900 |
| -97 | 2.4966 | 17.4762 | 13.2262 |
| -137 | 2.6751 | 18.7257 | 14.4757 |
| -149 | 2.7204 | 19.0428 | 14.7928 |
| -151 | 2.7277 | 19.0939 | 14.8439 |
| -157 | 2.7490 | 19.2430 | 14.9930 |
| -179 | 2.8221 | 19.7547 | 15.5075 |
| -199 | 2.8825 | 20.1775 | 15.9275 |
| -223 | 2.9489 | 20.6423 | 16.3923 |
| -227 | 2.9594 | 20.7158 | 16.4658 |
| -263 | 3.0478 | 21.3346 | 17.0846 |
| -283 | 3.0928 | 21.6496 | 17.3996 |
| -293 | 3.1144 | 21.8008 | 17.5508 |
| -383 | 3.2858 | 23.0006 | 18.7506 |
| -389 | 3.2960 | 23.0720 | 18.8220 |
| -503 | 3.4699 | 24.2893 | 20.0393 |

FIG. 6B

| Cable Dash No. | 5/dash √/ no. Factor | Smallest Length 5.250" Cable Length | Cable Span | Manufacturing Tolerances + | Manufacturing Tolerances − | |
|---|---|---|---|---|---|---|
| -1 | 1.0000 | 5.2500 | 1.0000 | 0.200 | 0.000 | |
| -3 | 1.2457 | 6.5399 | 2.2899 | 0.000 | 0.200 | |
| -5 | 1.3797 | 7.2434 | 2.9934 | 0.100 | 0.100 | |
| -7 | 1.4758 | 7.7480 | 3.4980 | 0.000 | 0.200 | |
| -13 | 1.6703 | 8.7691 | 4.5191 | 0.100 | 0.100 | |
| -17 | 1.7623 | 9.2521 | 5.0021 | 0.100 | 0.100 | |
| -19 | 1.8020 | 9.4605 | 5.2105 | 0.000 | 0.200 | Matched #1 |
| -23 | 1.8722 | 9.8291 | 5.5791 | 0.000 | 0.200 | |
| -29 | 1.9610 | 10.2953 | 6.0453 | 0.100 | 0.100 | Matched #2 |
| -31 | 1.9873 | 10.4333 | 6.1833 | | | |
| -37 | 2.0589 | 10.8092 | 6.5592 | 0.100 | 0.100 | |
| -43 | 2.1217 | 11.1389 | 6.8889 | | | |
| -47 | 2.1598 | 11.3390 | 7.0890 | | | |
| -59 | 2.2603 | 11.8666 | 7.6166 | | | |
| -61 | 2.2754 | 11.9459 | 7.6959 | | | |
| -79 | 2.3962 | 12.5801 | 8.3301 | | | |
| -83 | 2.4200 | 12.7050 | 8.4550 | 0.100 | 0.100 | |
| -97 | 2.4966 | 13.1072 | 8.8572 | | | |
| -137 | 2.6751 | 14.0443 | 9.7943 | | | |
| -149 | 2.7204 | 14.2821 | 10.0321 | | | |
| -151 | 2.7277 | 14.3204 | 10.0704 | 0.100 | 0.100 | |

FIG. 7A

| Cable Dash No. | $\sqrt{5/\text{dash no.}}$ Factor | Smallest Length 5.250" Cable Length | Cable Span | Manufacturing Tolerances + | − |
|---|---|---|---|---|---|
| -157 | 2.7490 | 14.4323 | 10.1823 | | |
| -179 | 2.8221 | 14.8160 | 10.5660 | | |
| -199 | 2.8825 | 15.1331 | 10.8831 | | |
| -223 | 2.9489 | 15.4817 | 11.2317 | | |
| -227 | 2.9594 | 15.5369 | 11.2869 | | |
| -263 | 3.0476 | 16.0010 | 11.7510 | | |
| -283 | 3.0928 | 16.2372 | 11.9872 | | |
| -293 | 3.1144 | 16.3506 | 12.1006 | 0.100 | 0.100 |
| -383 | 3.2858 | 17.2505 | 13.0005 | | |
| -389 | 3.2960 | 17.3040 | 13.0540 | | |
| -503 | 3.4699 | 18.2170 | 13.9670 | 0.100 | 0.100 |

FIG. 7B

DISTRIBUTED REFLECTION SCRAMBLING TECHNIQUE

This application is a continuation of application Ser. No. 07/612,441, filed Nov. 14, 1990, now abandoned.

BACKGROUND OF THE INVENTION

1. Field of the Invention

This invention relates to the field of radio frequency and microwave system design, and more particularly to a method of defining radio frequency and microwave system component lengths.

2. Description of Related Art

The efficiency of radio frequency or microwave systems which utilize waveguide structures to carry information is limited by the inherent tendency of electromagnetic radiation to reflect at impedance discontinuities in such systems.

Each interconnection point presents discontinuities to the power flowing through the path. The discontinuities cause some of the power to be reflected and travel the path in a reverse direction, which results in a standing wave pattern of energy in each structure. On the system level, much of the distributed reflected energy will show up as energy reflected from the system input, while a fraction of the energy will be converted into heat losses. Both the reflected energy and the heat losses reduce the amount of power available at the system output, and therefore the efficiency of the system.

This reflective phenomenon may be quantized in a variety of ways, e.g., voltage standing wave ratio (VSWR), return loss (RL), or insertion loss (IL), each of which is an expression of lost or reflected power. However, while each radio frequency or microwave system component and interconnecting waveguide or cable has an intrinsic VSWR, RL, and IL, the response characteristics of a system made up of such components is determined not only by the response characteristics of the individual components, but also by the manner in which the individual components are interconnected.

Power loss specifications contain no phase information, and thus cannot be used to predict the manner in which voltage phasors of the reflected waves will combine and propagate through the system, increasing the overall system loss. The standing waves which give rise to VSWR losses interact with each other on a system level, causing in-phase voltage phasors of each component to add, creating a much higher system VSWR.

This interaction of voltage standing wave ratios can be viewed as a situation where two half-silvered mirrors are in the power path facing each other. The power that is transmitted through the pair is reduced or enhanced due to the combination of the voltage vector reflections bouncing infinitely many times between the reflective faces.

It will be appreciated that such interaction is clearly dependent on the relative phasing of the reflection vectors at each mirror's face. Since voltage standing wave ratio is a magnitude relationship and does not contain phase information, the exact impact of this interaction cannot be predicted from VSWR specifications or measurements. The worst case situation can, however, be calculated from voltage standing wave ratios as a function of a maximum in-phase situation, thus enabling accurate prediction of the worst case uncertainty in measured power values.

The most common method for minimizing power lost through reflection and conversion into heat is through impedance matching techniques. When the impedance of one section on the circuit is matched to the impedance of the previous section, usually by using the complex conjugate of the impedance of the previous section, maximum power transfer is achieved by reducing the degree of discontinuity between devices at which reflection occurs.

Impedance matching techniques are complicated, requiring both magnitude and phase information for individual components, and are limited in the frequency range across which they can perform their desired function. Because impedance is a function of frequency, the broader the frequency band of operation for the system, the harder the impedance matching technique is to implement.

Impedance matching techniques are especially impractical in systems, such as test systems, which are designed to respond to the entire coaxial operating frequency range, presently considered to be DC to 40 GHz in reasonably mature technology, and in which most component specifications, with the exception of cable lengths, are dictated by requirements relating to the function of the system and therefore are not variable by the system designer for the purpose of minimizing reflections. These types of systems employ architectures that are low-loss, bidirectional, and have little reverse isolation from one section of the circuit to the next.

The extremely broad frequency response required of such systems precludes the use of impedance matching techniques to minimize reflections. Other conventional methods, for example, those which depend on selecting appropriate component VSWR or RL specifications in certain limited frequency ranges, are also inadequate to control the interactions of the distributed reflections in extended bandwidth systems, and thereby minimize system level reflections across the entire frequency range.

Even when impedances are matched to the greatest extent possible, the use of identical components, or cables of identical lengths to interconnect the components, presents the situation of a "periodic" structure. At certain frequencies, the reflection from the far end of, for example, a cable or a cable-switch structure, will combine in phase with the reflection from the near end of the structure, and this composite reflection will propagate through the system circuit in the reverse direction. Such in-phase combinations create a situation of high system reflection and high system losses due to the distributed circuit reflections, causing sharp power losses at the frequency or frequencies at which the reflections combine in phase.

Furthermore, when cables having different, but wavelength-related lengths are used, the same situation can arise. For example, assume that an 8 inch cable and a 14 inch cable are used in the system path. It will be noted that 14 is not an even multiple of 8. Nevertheless, for wavelengths of 4 inches, 2 inches, 1 inch, ½ inch, and so forth, the power reflected from the far end of the cable will combine in-phase with that from the near end of the cable, for both cables. For wavelengths close to the nominal values, nearly in-phase combinations will occur.

This is referred to as a "periodic situation due to multiplicity" and results when one cable or component length is a multiple or a combination of other cable or component lengths. In order to prevent this situation from arising, all possible periodic or multiplicity relationships between elements of the system must be eliminated. Because of the large number of different possible relationships between numbers which might give rise to multiplicity situations over the frequency range of the system, however, it has heretofore been virtually impossible to design a system which completely eliminates such relationships over a wide range of frequencies.

The broadband, low loss nature of the test systems referred to above present special difficulties in finding a solution to this problem. The consequence of the limitation of working only with cable lengths is that a total and complete solution cannot possibly be realized because repetitions of the same switch or other component in a path will always present a degree of periodicity to the power flowing in the path. Nevertheless, weakening the periodic structure by altering the cable lengths used to construct a path would be highly advantageous.

SUMMARY OF THE INVENTION

It is an objective of the invention to overcome the drawbacks of the prior art by providing a method of defining cable lengths that do not present a periodic structure and that are independent of each other on a broadband basis.

More generally, the invention has as an objective the provision of a method of defining broadband, independent component lengths in general so as to prevent voltage reflections in a radio frequency or microwave system from combining in-phase.

In order to accomplish these objectives, the component or cable lengths are varied by using prime roots of prime numbers as scaling factors. By selecting a sufficiently large quantity of resulting lengths, and distributing the resulting lengths strategically throughout the system, the situation of worst case voltage addition is avoided and the interactions of the distributed reflections are scrambled across the entire frequency range.

For any given cable, the situation of worst case voltage addition will occur at a specific frequency or frequencies. This is inherent in the cable and cannot be avoided. The method for defining the choices of cable lengths presented herein ensures that the frequencies of worst case voltage addition for any one cable will be different than for any other cable, and will therefore minimize system level reflections for all frequencies.

A first step of the inventive method is to select a "prime number system" for scaling the component lengths. The prime number system is expressed as a table of scaling factors which, when multiplied with a minimum cable length, results in a table of "scrambled" potential cable lengths from which the final cable lengths are selected.

The prime number system consists of taking a root of prime numbers, preferably a prime root of prime numbers, to generate the component length scaling factors. The degree of the prime root is selected so as to give a sufficient number of potential cable lengths within a range determined by other system design parameters, such as the span between components and the degree of curvature of the cables.

Once a table of potential cable lengths has been generated, a second step of the inventive method is to screen the table for undesired periodic relationships with lengths generated from a lower order root system. In practice, cable manufacturing tolerances define the "window" around each potential cable length which determines whether an undesired relationship is present.

After the screening, the tolerance windows are adjusted in a third step to maximize the distance between the remaining cable lengths and the undesired roots. In addition, if the choice of potential cable lengths turns out to be unsatisfactory at any time during the selection process, the tolerance windows and the minimum and maximum cable lengths may be readjusted and new tables of potential cable lengths generated to satisfy system parameters.

As a result of the preferred method of the invention, the following advantages are obtained:

1. The interactions of distributed reflections are scrambled, resulting in a minimized system level reflection for all frequencies.
2. Predictability of the system's worst case voltage standing wave ratio from the insertion loss and voltage standing ratio specifications of the components by utilizing a power analysis on the system are enhanced.
3. Insertion loss is minimized for all frequencies due to the lack of worst case distributed reflection interactions, resulting in optimized system dynamic power range.
4. In the case of a test system power measurement, accuracy is optimized for all frequencies due to the fact that the single greatest cause of error in power measurement is the interaction of the measurement instrument's reflection (voltage standing wave ratio) with the reflection (voltage standing wave ratio) of the system in which the measurement instrument resides or to which it is connected.

BRIEF DESCRIPTION OF THE DRAWINGS

FIG. 1 is a table of twelve scrambled cable lengths obtained according to the method of a preferred embodiment of the invention.

FIG. 2 is a prime factor table for second root factors.

FIGS. 3A and 3B are third root prime factor tables.

FIGS. 4A–4E are fourth root prime factor tables.

FIGS. 5A–5E are fifth root prime factor tables.

FIGS. 6A and 6B show the results of a first cut using the fifth root prime factor tables of FIG. 5.

FIGS. 7A and 7B show the results of a second cut using the fifth root prime factor table.

DETAILED DESCRIPTION OF THE PREFERRED EMBODIMENT

Briefly, a method according to a preferred embodiment of the invention generally includes the following steps, each of which is described in more detail below.

Initially, a prime number relationship, such as a relationship defined by taking roots of prime numbers, and preferably using prime roots of prime numbers, is selected and a table of potential component or cable lengths is constructed by using factors in the prime number relationship as scaling factors for scaling a minimum cable length to obtain a table of potential cable lengths.

The lengths obtained during the first step are then screened for undesired relationships with lengths obtained by using lower order roots as scaling factors. In order to screen the lengths for undesired relationships, "windows" are constructed around each of the lengths.

After the first screening or after any subsequent step in the preferred process, the choice of lengths may be evaluated and, if necessary, either step 2 or both steps 1 and 2 are repeated using a different root system and/or a different minimum length. Factors in the reevaluation include available spans between components of the system and cable curvatures, as well as the number of different lengths.

In order to maximize the distance between the potential lengths and those obtained using lower order roots, the windows may be adjusted so that the actual manufactured cable lengths are less likely to be near an undesired length.

Finally, a selection of lengths to be used in the system in question is made from the final table of potential lengths.

Although the following description refers primarily to cable lengths, it is to be understood that the method of the invention is intended to apply to lengths of components other than cables.

I. Selection of a Prime Number Relationship and Construction of an Initial Table of Potential Cable Lengths.

The preferred method of the invention generally involves the step of selecting component or cable lengths related by a prime number relationship in order to avoid problems of path length periodicity and multiplicity which exacerbate the additive effect of component level voltage standing wave ratios. The preferred method thus minimizes system level voltage standing wave ratios.

In a periodic or multiplicity situation, the reflected voltage phasor contributions of the individual cables can add in the same direction repeatedly throughout the system to foster the phenomenum of a worst case combination of reflected voltage vectors. By avoiding cable length relationships in which cable lengths are multiples of each other, the preferred method of the invention scrambles the path lengths and, consequently, the reflected voltage vector phase combinations in a broadbard manner. Distributing a sufficiently large selection of cable lengths strategically throughout the system enhances the situation of effectively restricting the reflected voltage vector phase combinations to that of a root sum square analysis.

This is the same as processing the phase combinations of the power vector rather than the voltage vector, because power is related to the square of the voltage. As long as the relationship is based on a prime number relationship, none of the cable lengths will be a root of, or have whole number factors in common with, any of the other cable lengths, aside from the common factor of unity.

It is of course possible to use the prime numbers themselves as scaling factors, but any such prime number relationship has the common factor of unity. For example, cable lengths defined in inches and related by prime numbers will still have undesired relationships for wavelengths of one inch, and also for even divisions of one inch such as ½ inch, ⅓ inch, ¼ inch, etc. This problem is solved by using roots of the prime numbers as scaling factors, rather than the prime numbers themselves.

Also, because the prime numbers themselves rapidly become too large for realistic scaling purposes, they must be scaled down to achieve reasonable length factors for any useful number of components. This problem is also solved by taking the roots of the prime numbers. The root itself must be a prime number, because non-prime roots have lower order roots as common factors, which may lead to multiplicity problems.

The main restriction is that the factor "two" should be avoided because the second harmonic is a very prevalent relationship in signals from power sources such as signal generators and amplifiers, which could lead to multiplicity problems. Therefore, only prime root systems such as the third, fifth, seventh, eleventh, thirteenth, etc., roots of the prime numbers should be used for the scaling factors.

Once the root system is chosen, a table of potential cable lengths is obtained by multiplying a selected minimum cable length by each of the roots in the system.

This is illustrated in FIGS. 2, 3A, 3B, 4A–4E and 5A–5E, wherein each of the entries in the tables is obtained by multiplying a minimum cable length given at the top of the table by scaling factors consisting of the prime root listed vertically on the tables. The respective figures show the second through fifth root systems and resulting scaled cable lengths for various selected minimum cable lengths. The "dash" number of each entry is the prime number whose root has been taken to obtain the scaling factor.

II. Comparison with Lower Order Roots.

Once a root system is chosen, the resulting scaled cable lengths should be screened against those obtained using smaller root systems to guard against an undesired multiple relationships which might accidentally occur. For example, if fifth root scaling is decided upon, the list of factors should be screened against those found by the second root, third root, and fourth root, as will be explained below.

In order to determine whether undesired relationships may arise between the potential lengths and those obtained using lower order roots, a criterion is needed for determining whether the chosen root is too close to the lower order root.

In the preferred method, the criterion for considering whether one factor is "too close" to another is the manufacturability of the resulting cable lengths i.e., the precision to which the cable lengths can be controlled. Although it is possible to strictly adhere to pure mathematical form, and reduce the method to a direct factor comparison, in practice this is not required.

A cable length is considered to overlap a length generated by another root if it is closer than 0.125 inches in either direction, which is slightly larger than the current manufacturing tolerance, thus forming a window around the cable length. If lower order roots fall within the window, then these cable lengths are discarded. Of course, if manufacturing techniques improve, the window would be made smaller than 0.250 inches.

FIGS. 2, 3A, 3B, 4A–4E, and 5A–5E are tables of prime roots from which the cable lengths for the chosen prime prime root system and minimum length are initially screened in a "first cut," the results of which are shown in 6A and 6B. In order to select the cable lengths, a smallest length is selected and scaled using the roots as scaling factors.

For purposes of illustration, the fifth root system was used to provide the cable lengths. The fifth root system was chosen because it provides 100 possible cable lengths between 7 inches and 24.48 inches, and also 100 choices between 5.5 inches and 19.24 inches. Lower order root tables provide less choices because the scaling factors increase at a faster rate.

The choice of root system will also depend on such factors as the number of different cables needed for the system and also the tolerances to which the cables can be manufactured. For example, if the tolerances are greater than $+/-0.125$ inches, there will be less possible choices for a specified table and it may be necessary to use a higher order root.

Similarly, if the range of "spans" between components, i.e., the distances which the cables must traverse is very narrow, a higher order root may be necessary in order to provide enough cable lengths in the narrower range.

Once a root system is initially selected and a table generated by multiplying each root in the root system by the chosen minimum cable length windows are constructed around the potential cable lengths with a width of plus or minus 0.125 inches around the lengths.

The lower order root tables are then examined to determine if cable lengths obtained using the lower order root systems and the same minimum cable length are within the window. For example, using the fith root table, dash numbers 41, 53 and 67 in FIG. 5A are discarded because they correspond, respectively, to dash number 19 on the 4th root table, dash number 11 on the 3rd root table, and dash number 29 on the 4th root table. The cable lengths remaining after this "first cut" are shown in FIGS. 6A and 6B.

III. Evaluation of First Cut Results.

After selecting a minimum length and constructing a list of available cable lengths, the list may be evaluated to see if the resulting lengths meet system requirements. For example, the list may lack sufficient short cable lengths, in which case a higher order root table or shorter minimum length would need to be chosen.

At this point, it may be helpful to add a list of spans for the cable lengths, as shown in FIGS. 6A and 6B. It should be noted that this table is taken from the fifth root table after screening in respect to the second through fourth root tables using a minimum length of seven inches.

The span associated with each length is determined by connector length and bend radii and is the minimum distance between components which can be connected by the cable length in question. In the illustrated example, 4.25 inches is subtracted from each cable length to obtain the listed cable span.

If the list of available spans turns out to be insufficient or inappropriate, a new minimum cable length or a new root system may be selected. The table shown in FIGS. 7A and 7B is based on a minimum length of 5.25 inches, obtained after adjustment for a 1.000 inch minimum span and a desired longest span of 14.000 inches. Also, it will be noted that, because of the change in minimum length, the tolerance window was changed from 0.250" to 0.200" (0.250 * 5.25/7.0=0.188). A window of 0.200" represents the minimum tolerance to which cable manufacturers will presently commit due to manufacturing yield considerations.

One of the criteria used for the example shown in the drawings was that two of the potential cable lengths will be manufactured such that their frequency response will fall within predetermined Insertion Loss windows. These two entries are referred to as "Matched #1" and "Matched #2" in FIG. 7A. In general, whenever particular cable lengths are required, an appropriate list may be selected to include those lengths.

IV. Window Adjustment

After evaluating the first cut and selecting new root systems, minimum lengths, or tolerance windows as necessary, the windows are preferably adjusted to maximize the distance between the cable lengths and the lengths obtained using undesired roots. For example, if a desired length is equidistant from two of the undesired roots, a symmetrical tolerance window is retained. However, if the desired length is closer in one directed to an undesired length, a 0.250 tolerance window having an asymmetrical +0.000/−0.250 or +0.250/−.000 relationship to the potential cable length may be constructed. Depending upon the specific relationship involved, other tolerance windows may be constructed such as +0.075/−0.175.

For cable length selection purposes, the chosen cable length becomes the center of the adjusted window, thus allowing for manufacturing tolerances in either direction from the chosen length.

V. Final Choices.

After adjusting the final tolerance windows, the system requirements may again be re-evaluated for shortest and longest cable requirements, as well as for other system requirements such as the need for insertion loss matched cables. Manufacturing tolerances may be constructed around some previously unconsidered lengths during this re-evaluation.

Finally, in the preferred embodiment, the final scrambled cable lengths are chosen, to be distributed as needed throughout the system paths based on the available spans. A table of cable lengths finally chosen for the above-described example, using a fifth root table and minimum length of 5.5 inches, is shown in FIG. 1.

It will of course be appreciated that variations of the above described method are possible, and it is therfore intended that the invention be limited soley by the appended claims.

I claim:

1. A method of minimizing reflections occuring in radio frequency or microwave systems over all signal frequencies, said method comprising the steps of:
   (a) selecting an initial prime number relationship;
   (b) generating a table of potential component lengths based upon the prime number relationship;
   (c) selecting final component lengths from the potential component lengths;
   (d) providing components for constructing a radio frequency or microwave system, each of said components having a different one of said selected final component lengths;
   (e) constructing said radio frequency or microwave system using said components; and
   (f) during construction of the system, preventing in-phase reflection combination of voltages in said system by distributing said components having said selected final component lengths throughout said radio frequency or microwave system as a function of available spans and curvatures between consecutive components, and of the number of individual components which comprises the radio frequency and microwave system.

2. A method as claimed in claim 1, wherein said component lengths are cable lengths.

3. A method as claimed in claim 1, wherein said prime number relationship is a prime root relationship and step (a) comprises the step of selecting a prime root system.

4. A method as claimed in claim 3, wherein said step of selecting a prime root system comprises the step of selecting a prime root system which will generate table lengths having at least the number of different component lengths required for the system.

5. A method as claimed in claim 3, wherein step (b) comprises the steps of selecting a minimum component length and multiplying said minimum component length by prime roots of prime numbers to obtain said potential component lengths.

6. A method as claimed in claim 3, further comprising the steps of: constructing a tolerance window around each of the component lengths in said table; comparing said table of potential component lengths with tables of component lengths obtained using lower order root systems; and eliminating potential component lengths whose windows include component lengths listed on said lower order root system tables.

7. A method as claimed in claim 6, further comprising the step of, if the number of potential component lengths is less than a required number of component lengths, selecting a higher order prime root system and repeating steps (b) and (c).

8. A method as claimed in claim 6, wherein the widths of said windows is the manufacturing tolerance for said component lengths.

9. A method as claimed in claim 8, further comprising the step of adjusting said windows to maximize both the plus and minus distances to adjacent component lengths in said table of potential component lengths.

10. A method as claimed in claim 9, wherein step (c) comprises the step of selecting said final component lengths from potential component lengths centered within said adjusted windows.

11. A method as claimed in claim 1, further comprising the step of calculating an available span for each potential component length.

12. A method as claimed in claim 11, wherein step (c) comprises the step of selecting said final component lengths by considering system span requirements.

13. A method as claimed in claim 1, wherein step (b) is repeated until a table of potential component lengths includes predetermined component lengths needed to meet system requirements.

14. A method of minimizing voltage reflections over all frequencies in radio frequency and microwave systems, said method comprising the steps of:
 (a) selecting a minimum component length;
 (b) scaling said minimum component length by multiplying it with prime roots of successive prime numbers to obtain a list of potential component lengths;
 (c) selecting final component lengths from among said potential component lengths;
 (d) providing components for constructing a radio frequency or microwave system, each of said components having a different one of said selective final components having a different one of said selected final component lengths; and
 (e) constructing said radio frequency or microwave system using said components; and
 (f) during construction of the system, preventing in-phase reflection combination of voltages in said system by distributing said components having said selected final component lengths throughout said radio frequency or microwave system as a function of available spans and curvatures between consecutive components, and of the number of individual components which comprises the radio frequency and microwave system.

15. A method as claimed in claim 14, wherein said components are waveguides.

16. A method as claimed in claim 15, wherein said waveguides are cables.

* * * * *